United States Patent [19]

Ono et al.

[11] Patent Number: 5,757,835
[45] Date of Patent: May 26, 1998

[54] SEMICONDUCTOR LASER DEVICE

[75] Inventors: Kenichi Ono; Hitoshi Tada, both of Tokyo, Japan

[73] Assignee: Mitsubishi Denki Kabushiki Kaisha, Tokyo, Japan

[21] Appl. No.: 778,507

[22] Filed: Jan. 3, 1997

[30] Foreign Application Priority Data

Jun. 27, 1996 [JP] Japan ................................. 8-167107
Oct. 18, 1996 [JP] Japan ................................. 8-276463

[51] Int. Cl.$^6$ ................................................ H01S 3/19
[52] U.S. Cl. ................................................ 372/46; 372/45
[58] Field of Search ................................. 372/46, 45

[56] References Cited

U.S. PATENT DOCUMENTS

| | | | |
|---|---|---|---|
| 5,042,045 | 8/1991 | Sato | 372/46 |
| 5,282,218 | 1/1994 | Okajima et al. | 372/45 |
| 5,544,185 | 8/1996 | Kadoiwa et al. | 372/45 |
| 5,559,821 | 9/1996 | Yagi | 372/45 |

FOREIGN PATENT DOCUMENTS

| | | | |
|---|---|---|---|
| 3-225985 | 10/1991 | Japan | 372/45 |
| 77219 | 1/1995 | Japan . | |
| 773148 | 8/1995 | Japan . | |

*Primary Examiner*—Rodney B. Bovernick
*Assistant Examiner*—Yisun Song
*Attorney, Agent, or Firm*—Leydig, Voit & Mayer, Ltd.

[57] ABSTRACT

A semiconductor laser device includes a structure in which a first conductivity AlGaInP first cladding layer, an active layer, a second conductivity type AlGaInP second cladding layer, a second conductivity type AlGaInP intermediate layer, and a second conductivity type AlGaInP third cladding layer are successively epitaxially grown on a first conductivity type GaAs semiconductor substrate. The intermediate layer is within a profile of light produced in the active layer and includes AlGaInP layers having a band gap energy smaller than the band gap energy of the second cladding layer and the third cladding layer and larger than the band gap energy of the active layer. The intermediate layer has a multi-layer structure in which $(Al_xGa_{1-x})InP$ layers ($0 \leq x \leq 0.2$) and $(Al_xGa_{1-x})InP$ layers ($0.5 \leq x \leq 1$) are alternatingly laminated. By adding a small amount of Al to the intermediate layer, the band gap energy of the intermediate layer is broadened to control absorption of light emitted from the active layer and an increase in the threshold current of laser oscillation is suppressed. Since the intermediate layer has a multi-layer structure, a semiconductor laser device with sufficient etch stopping effect during etching of an off (100) substrate is realized.

2 Claims, 5 Drawing Sheets

Fig. 1
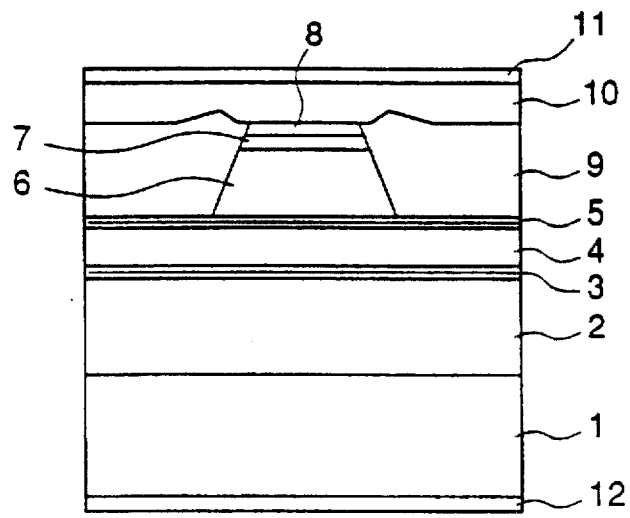
Fig. 2(a)
Fig. 2(b)
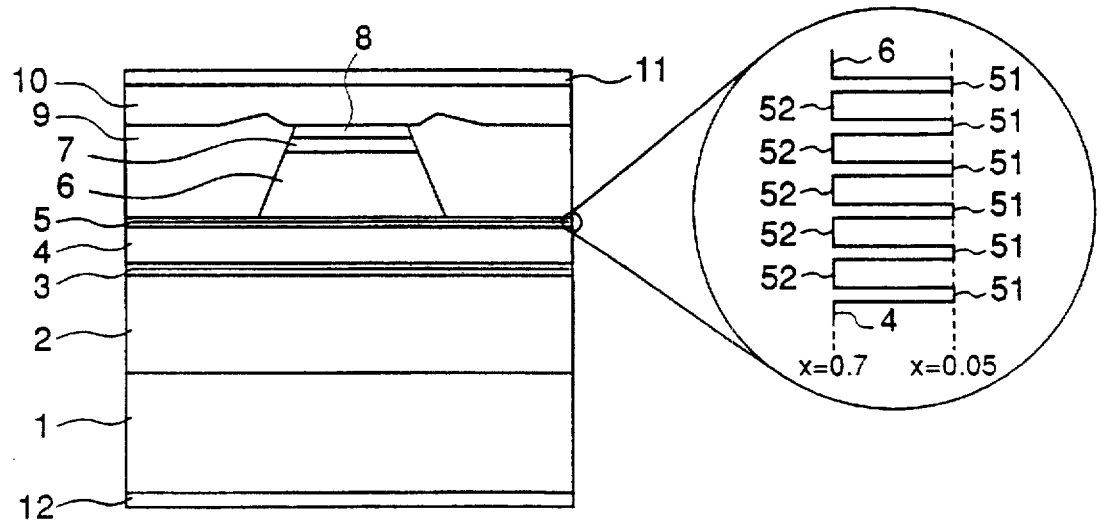

SEMICONDUCTOR LASER DEVICE

FIELD OF THE INVENTION

The present invention relates to a semiconductor laser device used for optical information processing, more specifically, a semiconductor laser device including an etch stopping layer that provides an etch stopping effect and improved device characteristics. The invention also relates to a method for fabricating the semiconductor laser device.

BACKGROUND OF THE INVENTION

FIG. 4 is a cross-sectional view illustrating a prior art semiconductor laser device used as a light source for various information processing devices. In FIG. 4, reference numeral 1 designates an n type GaAs semiconductor substrate, numeral 2 designates an n type AlGaInP first cladding layer disposed on a front surface of the n type GaAs semiconductor substrate 1, numeral 3 designates a multi-quantum well active layer comprising GaInP and AlGaInP and disposed on the n type AlGaInP first cladding layer 2, and numeral 4 designates a p type AlGaInP second cladding layer disposed on the multi-quantum well active layer 3. Reference numeral 21 designates a p type GaInP intermediate layer disposed on the p type AlGaInP second cladding layer 4. The intermediate layer 21 functions as an etch stopping layer and is within a profile of light emitted from the active layer 3. Reference numeral 6 designates a p type AlGaInP third cladding layer disposed on the intermediate layer 21, numeral 7 designates a p type GaInP transition layer disposed on the p type AlGaInP third cladding layer 6, and numeral 8 designates a p type GaAs cap layer disposed on the p type GaInP transition layer 7. The third cladding layer 6, the transition layer 7, and the cap layer 8 form a stripe-shaped mesa structure. Reference numeral 9 designates n type GaAs current blocking layers disposed at opposite sides of the mesa structure, and numeral 10 designates a p type GaAs contact layer disposed on the p type GaAs cap layer 8 and on the n type GaAs current blocking layers 9. Reference numeral 11 designates a p side electrode disposed on the p type GaAs contact layer 10 and numeral 12 designates an n side electrode disposed on a rear surface of the n type GaAs semiconductor substrate 1.

A description is given of a method for fabricating the semiconductor laser device.

Initially, there are successively epitaxially grown on the semiconductor substrate 1 the first cladding layer 2, the multi-quantum well active layer 3, the second cladding layer 4, the intermediate layer 5, the third cladding layer 6, the transition layer 7, and the cap layer 8 by MOCVD. Thereafter, an SiN film is patterned on the cap layer 8. Using the SiN film as a mask, the cap layer 8, the transition layer 7, and the third cladding layer 6 are etched to the intermediate layer 21 serving as an etch stopping layer, thereby forming a stripe-shaped mesa structure. In the etching process, for example, an etchant comprising aqueous ammonia and aqueous hydrogen peroxide is used for the cap layer 8, a hydrochloric acid based etchant is used for the transition layer 7, and a sulfuric acid based etchant is used for the third cladding layer 6, respectively. Thereafter, spaces formed by the etching are filled with the n type GaAs current blocking layers by selective epitaxial growth by MOCVD, and the SiN film on the cap layer 8 is removed. Then, the contact layer 10 is epitaxially grown on the entire structure. Finally, the p side electrode 11 is formed on the contact layer 10 and the n side electrode 12 is formed on the rear surface of the substrate 1, thereby completing the semiconductor laser device shown in FIG. 4.

A description is given of the operation of the semiconductor laser device.

When a plus voltage is applied to the p side electrode and a minus voltage is applied to the n side electrode, electrons are injected into the active layer 3 through the semiconductor substrate 1 and the first cladding layer 2. On the other hand, holes are injected into the active layer 3 through the contact layer 10, the cap layer 8, the transition layer 7, the third cladding layer 6, the intermediate layer 21, and the second cladding layer 4. In this way, electrons and holes recombine in the active layer 3, and induced light emission occur in the active layer 3. Further, when light exceeding the loss in the light waveguide is generated by sufficiently increasing the injected charge carriers, i.e., electrons and holes, laser oscillation occurs.

In the semiconductor laser device, in order to produce light having a wavelength band of 635–650 nm, the wavelength of the active layer 3 is shortened. Then, the difference in energy band gaps between the active layer 3 and the intermediate layer 21 serving as an etch stopping layer becomes small, and light absorption in the intermediate layer 21 becomes large, resulting in an increase in operating current of the semiconductor laser. Therefore, it is necessary to make the intermediate layer 21 sufficiently thin in accordance with the reduction in the wavelength of the active layer 3.

In the prior art semiconductor laser device, the etch stopping effect of the intermediate layer 21 is unfavorably lowered for the reasons mentioned hereinafter.

First, an etchant having sufficient selectivity for the transition layer 7 and the third cladding layer 6, which layers are necessary for reducing the difference in energy band gaps, has not been discovered yet. When the third cladding layer 6 and the intermediate layer 21 are etched, the thickness of a residual portion of the third cladding layer 6 is indefinite. Therefore, in a case where the intermediate layer 21 is not sufficiently thick, etching does not stop at the intermediate layer 21 when the etching depth is controlled by the etching time, so the second cladding layer 4 is also etched, resulting in a distortion in the beam shape of the semiconductor laser device.

Second, when a semiconductor laser having a short wavelength is desired, a method using a slightly inclined substrate (hereinafter, referred to as off (100) substrate) is usually employed to disorder a natural superlattice of the active layer 3. In this method, an etching rate of the p type GaInP intermediate layer 21, which is epitaxially grown on the off (100) substrate, by a sulfuric acid based etchant, is clearly larger than that on a just (100) substrate, as shown in FIG. 5(b). On the other hand, the etching rate of the AlGaInP cladding layers 4 and 6 contrasts with that of the GaInP layer, as shown in FIG. 5(a). The etching rate of the p type AlGaInP cladding layers, which are epitaxially grown on the off (100) substrate, is smaller than that on the just (100) substrate. Therefore, the etching selectivity of the intermediate layer 21 with respect to the second cladding layer 4 is reduced to half of the off (100) substrate selectivity. Also in this case, etching does not stop at the intermediate layer 21, so the second cladding layer 4 is also etched, resulting in a distortion in the beam shape of the semiconductor laser device. In FIGS. 5(a) and 5(b), straight line A indicates a p type AlGaInP cladding layer epitaxially grown on the just (100) substrate, straight line A' indicates a p type AlGaInP cladding layer epitaxially grown on the off (100) substrate, straight line B indicates a p type GaInP intermediate layer epitaxially grown on the off (100) substrate, and straight line B' indicates a p type GaInP intermediate layer epitaxially grown on the just (100) substrate.

FIG. 6 is a cross-sectional view illustrating another prior art semiconductor laser device.

As shown in FIG. 6, the semiconductor laser device has a mesa structure 200, and there are successively disposed on a front surface of an n type GaAs substrate 110 an n type GaAs buffer layer 120, an n type InAlGaP first cladding layer 100, an InGaP active layer 20, a p type InAlGaP second cladding layer 30, an InGaP intermediate layer 40, a p type InAlGaP third cladding layer 50, an InGaP transition layer 60, and a p type GaAs contact layer 70. Further, an electrode 80 is disposed on the top of these semiconductor layers and a an electrode 90 is disposed on a rear surface of the n type GaAs substrate 110. Since the thickness of the second cladding layer 30 is about 0.2 μm, the intermediate layer 40 is within a light amplification profile of the active layer 20.

In the semiconductor laser device, since the intermediate layer 40 comprises an InGaP layer having a lattice constant different from that of the substrate 110 and includes about 40-atomic percent of In in the InGaP layer so as to have an energy band gap larger than the energy of the light emitted from the active layer 20, absorption of light radiated from the active layer 20 in the intermediate layer 40 is reduced, and the intermediate layer 40 has a low starting current.

In the semiconductor laser device shown in FIG. 6, the composition of InGaP is changed to make the energy band gap of the intermediate layer large. However, since misfit dislocations occur when the difference in lattice constants between the intermediate layer and the substrate is large, the composition can not be significantly changed. In addition, the intermediate layer can not be made thick because it is necessary to suppress light absorption and to prevent the thickness of the intermediate layer from exceeding the critical thickness at which dislocations occur. Therefore, when the off (100) substrate is employed as shown in FIG. 5, it is difficult to obtain a sufficient etch stopping effect by the etch stopping layer.

FIG. 7 is a cross-sectional view illustrating still another prior art semiconductor laser device, and FIG. 8 is an enlarged sectional view illustrating an etch stopping layer of the semiconductor laser device in FIG. 7.

In the semiconductor laser device, as shown in FIGS. 7 and 8, there are successively grown on an n type GaAs substrate 102 an n type AlGaInP first cladding layer 201 that is 1.3 μm thick, an undoped AlGaInP first light guide layer 31 that is 15 nm thick, a multi-quantum well active layer 41 comprising eleven alternating undoped AlGaInP quantum barrier layers that are 5 nm thick and ten undoped GaInP quantum well layers that are 3 nm thick, an undoped AlGaInP second light guide layer 500 that is 15 nm thick, a p type AlGaInP second cladding layer 61 that is 0.2 μm thick, a superlattice etch stopping layer 71 comprising for alternating p type GaInP etch stopping layers 161 that are 1.5 nm thick and three p type AlGaInP layers 151 that are 10 nm thick, a p type AlGaInP layer 81 that is 20 nm thick, the superlattice etch stopping layer 71, a p type AlGaInP third cladding layer 91 that is 0.8 μm thick, and a p type GaInP buffer layer 101 that is 22 nm thick, at a temperature of 700° C. by MOCVD. The p type GaInP buffer layer 101 and the p type AlGaInP third cladding layer 91 are etched to the p type GaInP etch stopping layer 71, leaving a ridge portion. Thereafter, the n type GaAs current blocking layers 111 that are 0.8 μm thick are selectively grown on the etch stopping layer 71 at opposite sides of the ridge portion, and the p type GaAs contact layer 121 2 μm thick is grown on the ridge portion and on the n type GaAs current blocking layers 111. Then, electrode metals 131 and 141 are disposed on a rear surface of the n type GaAs substrate 102 and on a front surface of the p type GaAs contact layer 121, respectively, by evaporation.

The semiconductor laser device has a superlattice structure comprising a plurality of etch stopping layers 161, each having such a thickness that can provide an effective difference in energy band gaps between the etch stopping layer 71 and the active layer 41 by a quantum effect. Thus, recombination of carriers in the etch stopping layer 71 is suppressed, so that carriers are effectively confined in the active layer 41, thereby suppressing an increase in a threshold current for laser oscillation. In addition, since a plurality of etch stopping layers 161 are provided, an unwanted reduction in the etch stopping effect due to thinning of the etch stopping layer is suppressed.

However, in this prior art semiconductor device, it is necessary to make the p type GaInP intermediate layer 21 very thin so that the p type GaInP layer has a band gap energy that can sufficiently suppress the light absorption by a quantum effect. For example, in the semiconductor laser device including the active layer 3 producing light in the 650 nm wavelength band, in order to obtain a sufficient difference in energy band gaps between the active layer 3 and the intermediate layer 21 (230 meV), the p type GaInP intermediate layer 21 must be thinner than 1 nm, which thickness is very thin, corresponding to two atomic layers.

SUMMARY OF THE INVENTION

It is an object of the present invention to provide a semiconductor laser device that suppresses light absorption in the intermediate layer formed on the second cladding layer, and that surely stops etching of the third cladding layer at the intermediate layer, thereby obtaining a low operating current and a reduced variation in characteristics.

It is another object of the present invention to provide a relatively simple method of fabricating the semiconductor laser device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser device comprises a structure in which a first conductivity type AlGaInP first cladding layer, an active layer, a second conductivity type AlGaInP second cladding layer, a second conductivity type AlGaInP intermediate layer, a second conductivity type AlGaInP third cladding layer are successively epitaxially grown on a first conductivity type GaAs semiconductor substrate. In this structure, the second cladding layer is formed so that the intermediate layer is within a photoelectromagnetic profile of the active layer, and the intermediate layer comprises AlGaInP layers each having a sufficiently thin thickness so as to have an energy band gap smaller than the energy band gap of AlGaInP constituting the second cladding layer and the third cladding layer and have an energy band gap larger than a radiant energy emitted from the active layer, and the intermediate layer has a multi-layer structure in which $(Al_xGa_{1-x})InP$ layers ($0<x\leq0.2$) and $(Al_xGa_{1-x})InP$ layers ($0.5\leq x\leq 1$) are alternatingly laminated. Since, by adding a very small amount of Al into the intermediate layer 5, the band gap width of the intermediate layer 5 is broadened to control absorption of light emitted from the active layer 3, an increase in the threshold current of laser oscillation is suppressed, thereby obtaining a semiconductor laser device having a small operating current. In addition, since the intermediate layer has a multi-layer structure, a semiconductor laser device that sufficiently shows the etch stopping effect also during the etching process of an epitaxial layer on an off (100) substrate lowering the etching selectivity is realized.

According to a second aspect of the present invention, a semiconductor laser device comprises a structure in which a first conductivity type AlGaInP first cladding layer, an active layer, a second conductivity type AlGaInP second cladding layer, a second conductivity type intermediate layer, a second conductivity type AlGaInP third cladding layer are successively epitaxially grown on a first conductivity type GaAs semiconductor substrate. In this structure, the second cladding layer is formed so that the intermediate layer is within a photoelectromagnetic profile of the active layer, and said intermediate layer comprising AlGaInP layers each having a sufficiently thin thickness so as to have an energy band gap smaller than the energy band gap of AlGaInP constituting the second cladding layer and the third cladding layer and have an energy band gap larger than a radiant energy emitted from said active layer, said intermediate layer having a multi-layer structure in which $(Al_xGa_{1-x})InP$ layers ($0 \leq x \leq 0.2$) and $(Al_xGa_{1-x})InP$ layers ($0.5 \leq x \leq 1$) are alternatingly laminated. In the intermediate layer, each layer constituting the intermediate layer is formed so that the integer multiple of the thickness is made equal to a wavelength of visible light, whereby interference fringes due to the intermediate layer disposed under the third cladding layer and having the multi-layer structure are observed during the etching process of the third cladding layer. Therefore, since interference fringes due to the intermediate layer are clearly observed during the etching process of the third cladding layer, the etch stopping effect is further improved, whereby a semiconductor laser device having a high controllability of the thickness of the second cladding layer without a distortion in beam shape is obtained.

According to a third aspect of the present invention, a method of fabricating a semiconductor laser device includes epitaxially growing on a first conductivity type semiconductor substrate a first conductivity type first cladding layer, an active layer, a second conductivity type second cladding layer, an intermediate layer having a multi-layer structure in which a plurality of second conductivity type semiconductor layers are laminated so that the integer multiple of the thickness is made equal to a wavelength of visible light, and a second conductivity type third cladding layer, and etching the third cladding layer, observing interference fringes due to the intermediate layer disposed under the third cladding layer and having the multi-layer structure and, then stopping the etching process. Therefore, the etch stopping point is recognized correctly and certainly during the etching process, whereby etching of the third cladding layer is accurately stopped to the intermediate layer.

BRIEF DESCRIPTION OF THE DRAWINGS

FIG. 1 is a cross-sectional view illustrating a semiconductor laser device in accordance with a first embodiment of the present invention.

FIG. 2(a) is a schematic view for explaining a multi-layer structure of a semiconductor laser device according to the first embodiment and FIG. 2(b) is a detail view of part of FIG. 2(a).

DETAILED DESCRIPTION OF THE PREFERRED EMBODIMENTS

Embodiment 1

Figure 3:
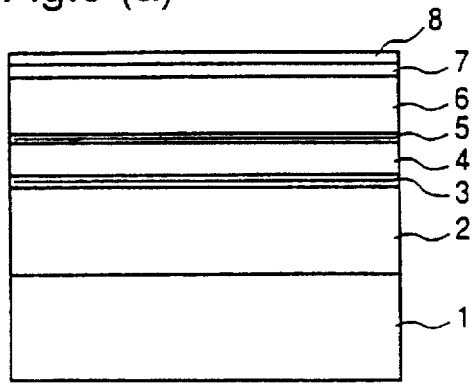
FIGS. 3(a)-3(e) are cross-sectional views illustrating a method of fabricating a semiconductor laser device according to the first embodiment.
Figure 3:
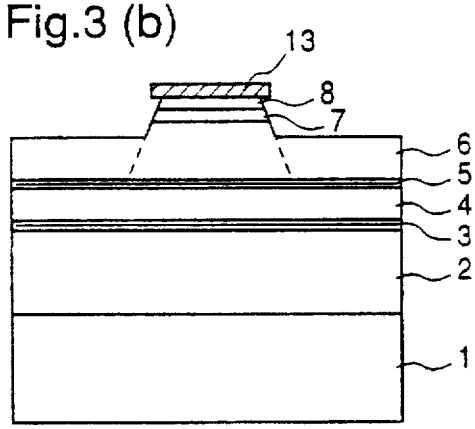
Figure 3:
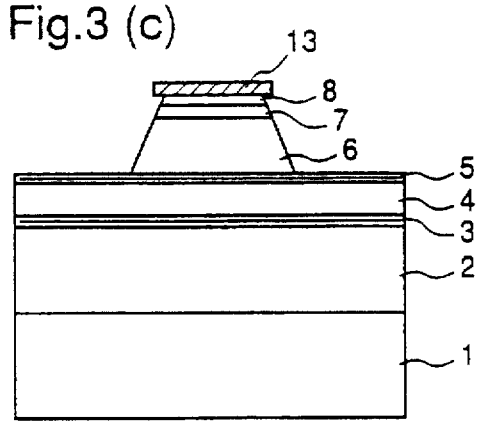
Figure 3:
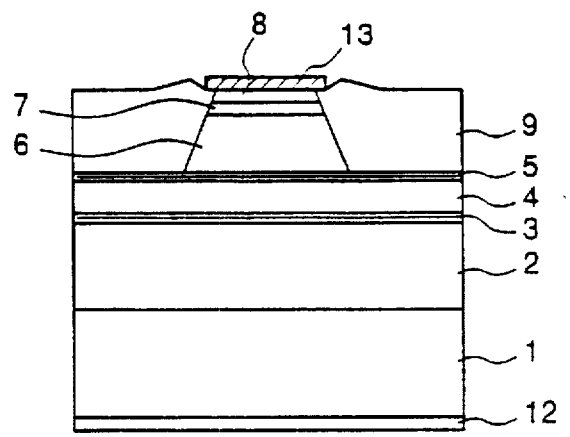
Figure 3:
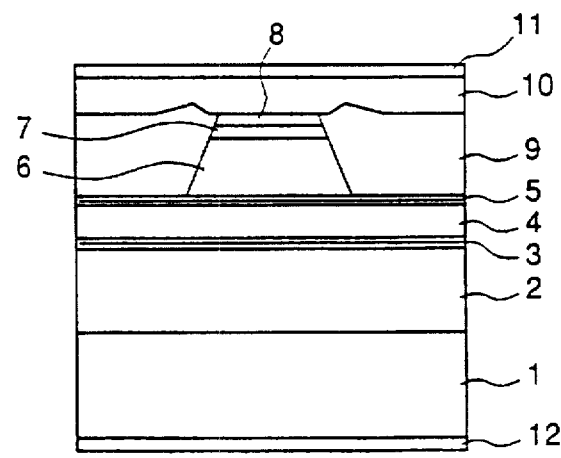
Figure 4:
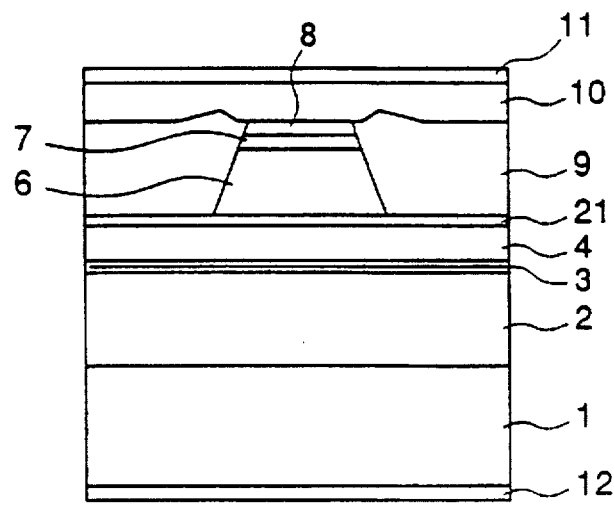
FIG. 4 is a cross-sectional view illustrating a prior art semiconductor laser device.
Figure 5:
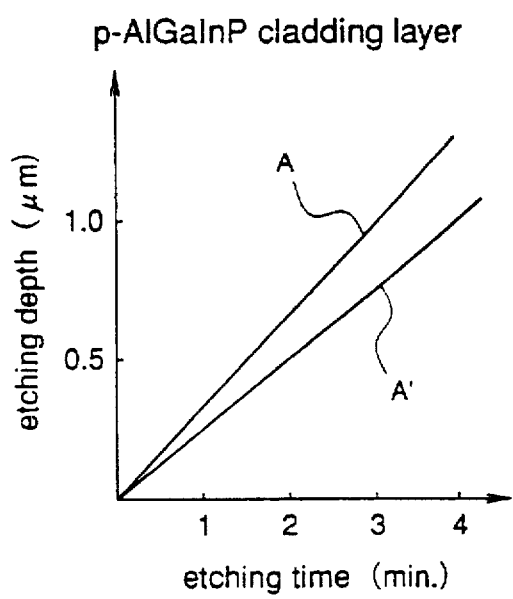
FIGS. 5(a) and 5(b) are graphs showing differences in etching rates between epitaxial layer on a just (100) substrate and an epitaxial layer on an off (100) substrate.
Figure 5:
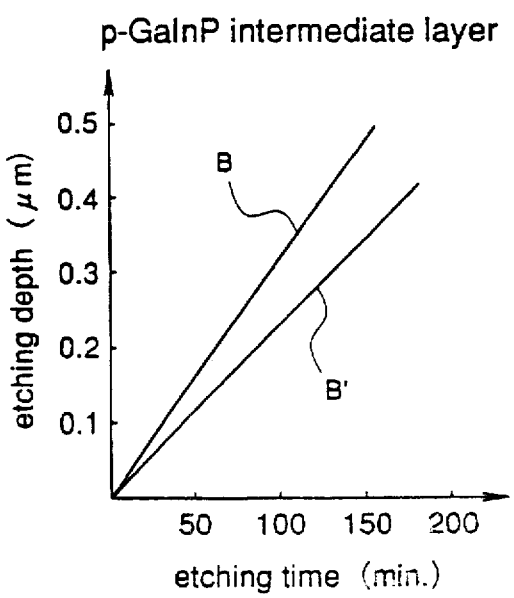
Figure 6:
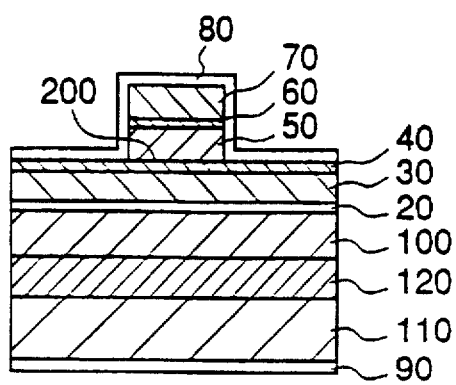
FIG. 6 is a cross-sectional view illustrating another prior art semiconductor laser device.
Figure 7:
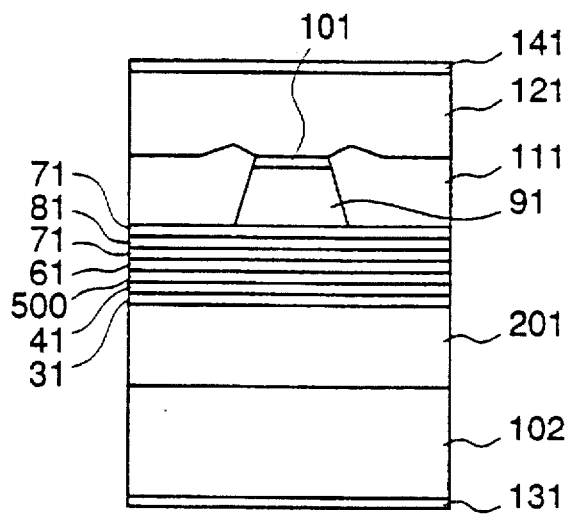
FIG. 7 is a cross-sectional view illustrating still another prior art semiconductor laser device.
Figure 8:
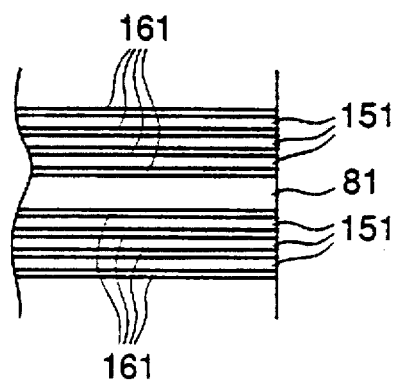
FIG. 8 is an enlarged view illustrating an etch stopping layer of the prior art semiconductor laser device shown in FIG. 7.

FIG. 1 is a cross-sectional view illustrating an AlGaInP series semiconductor laser device in accordance with a first embodiment of the present invention. FIGS. 2(a) and 2(b) are schematic views illustrating an intermediate layer 5 included in the semiconductor laser device shown in FIG. 1.

In the semiconductor laser device according to the first embodiment of the invention, as shown in FIGS. 1 and 2(a) and 2(b), reference numeral 1 designates an n type GaAs semiconductor substrate. An n type AlGaInP first cladding layer 2 comprising $(Al_xGa_{1-x})InP$ (x=0.7) and having a thickness of 0.2 μm is disposed on the n type GaAs semiconductor substrate 1. A multi-quantum well active layer 3 comprises four AlGaInP buffer layers about 80 nm thick and three GaInP well layers about 80 nm thick which are alternatingly laminated, and this active layer 3 is disposed on the first cladding layer 2 to produce a total thickness of about 1.0 μm. A p type AlGaInP second cladding layer 4 comprising $(Al_xGa_{1-x})InP$ (x=0.7) is disposed on the multi-quantum well active layer 3 with a thickness of about 0.2 μm. A p type AlGaInP intermediate layer 5 serving as an etch stopping layer is disposed on the second cladding layer 4. Since the second cladding layer 4 below the intermediate layer 5 has a thickness of 0.2 μm, the intermediate layer 5 is within a profile of light emitted from the active layer 3. A p type AlGaInP third cladding layer 6 comprising $(Al_xGa_{1-x})InP$ (x=0.7) is disposed on the intermediate layer 5 in a thickness of about 1.3 μm. A p type GaInP transition layer 7 that is 0.1 μm thick is disposed on the third cladding layer 6. A p type GaAs cap layer 8 that is 0.1 μm thick is disposed on the transition layer 7. The third cladding layer 6, the transition layer 7, and the cap layer 8 form a stripe-shaped mesa structure. N type GaAs current blocking layers 9, each having a thickness of about 1.5 μm, are formed on opposite sides of the mesa structure. A p type GaAs contact layer 10 is disposed on the cap layer 8 and the current blocking layers 9 to have a thickness of 2~3 μm. A p side electrode 11 is disposed on the contact layer 10 and an n side electrode 12 is disposed on a rear surface of the substrate 1.

A description is given of the operation of the semiconductor laser device.

When a plus voltage is applied to the p side electrode 11 and a minus voltage is applied to the n side electrode 12, electrons are injected into the active layer 3 through the substrate 1 and the first cladding layer 2. On the other hand, holes are injected into the active layer 3 through the contact layer 10, the cap layer 8, the transition layer 7, the third cladding layer 6, the intermediate layer 5, and the second cladding layer 4. Therefore, electrons and holes recombine in the active layer 3, and induced light emission occurs in the active layer 3. Further, when injected amount of carriers, i.e., electrons and holes, is sufficiently increased to generate light exceeding the loss in the light waveguide, laser oscillation occurs.

Next, a description is given of the intermediate layer 5 serving as the etch stopping layer.

The intermediate layer 5 has a multi-layer structure in which six p type $(Al_xGa_{1-x})InP$ (x=0.05) layers 51, each having a thickness of 2–6 nm, and five p type $(Al_xGa_{1-x})InP$ (x=0.7) layers 52, each having a thickness of several nanometers to several tens of nanometers, are alternatingly laminated as shown in FIG. 2(b).

The intermediate layer 5 comprises AlGaInP having a smaller energy band gap than the energy band gap of AlGaInP as a material of the second cladding layer 4 and the third cladding layer 6. That is, the Al composition of the p type AlGaInP intermediate layer 5 is smaller than Al composition of the p type AlGaInP second cladding layer and the p type AlGaInP third cladding layer. Besides, Al composition x of the p type $(Al_xGa_{1-x})InP$ layer 51 is not restricted to this value but can be set in a range of $0<x\leq 0.2$, preferably, a range of $0<x\leq 0.08$. In addition, Al composition x of the p type $(Al_xGa_{1-x})InP$ layer 52 is not restricted to this value but can be in a range of $0.5\leq x\leq 1$.

Since a small quantity of Al is added to the intermediate layer 5, the band gap energy of the intermediate layer 5 is widened and the absorption of light emitted from the active layer 3 is suppressed. In this case, the band gap width is increased with an increase in the quantity of the added Al, but there is a risk that etching selectivity may be reduced when the third cladding layer 6 is subjected to ridge etching and the etch stopping effect is reduced. Therefore, it is not desired to make the Al composition x of the $(Al_xGa_{1-x})InP$ layer 51 larger than 0.2 because there is a risk of reduction in the etch stopping effect. For example, when Al composition x of the $(Al_xGa_{1-x})InP$ layer 51 is set at 0.05, a difference in energy band gaps, 230 meV, between the layer 51 and the active layer 3 in 650 nm band, is maintained, while the thickness of the layer 51 is set at 2.25 nm. In addition, when the Al composition x is increased to 0.08, it is possible to maintain a sufficient difference in energy band gaps between the layer 51 and the active layer 3 even though the thickness of the layer 51 is set at 3 nm.

A description is given of a method of fabricating a semiconductor laser device according to the first embodiment of the invention.

FIGS. 3(a)–3(e) are cross-sectional views illustrating a process step in the method of fabricating a semiconductor laser device according to the first embodiment. Initially, in the step of FIG. 3(a), there are successively epitaxially grown on the n type GaAs semiconductor substrate 1 the n type AlGaInP first cladding layer 2, the multi-quantum well active layer 3, the p type AlGaInP second cladding layer 4, the intermediate layer 5 including, alternatingly laminated six p type $(Al_xGa_{1-x})InP$ (x=0.05) layers 51 and five p type $(Al_xGa_{1-x})InP$ (x=0.7) layers 52, the p type AlGaInP third cladding layer 6, the p type GaInP transition layer 7, and the p type GaAs cap layer 8, by MOCVD.

In the step of FIG. 3(b), an SiN film 13 is patterned on the cap layer 8. Using the SiN film 13 as a mask, the cap layer 8, the transition layer 7, and the third cladding layer 6 are etched to form a stripe-shaped mesa structure. In this etching process, for example, an etchant comprising aqueous ammonia and aqueous hydrogen peroxide is used for the cap layer 8, a hydrochloric acid based etchant is used for the transition layer 7, and a sulfuric acid based etchant is used for the third cladding layer 6, respectively. In the etching of the transition layer 7, however, since an etchant having a sufficient selectivity between the transition layer 7 and the third cladding layer 6 has not been discovered yet, etching proceeds in the middle of the third cladding layer 6, as shown in FIG. 3(b). Therefore, the thickness of a residual portion of the third cladding layer 6 is indefinite, and it is difficult to stop the etching of the third cladding layer 6 at the intermediate layer 5 by time control. On the contrary, since the intermediate layer 5 of the semiconductor laser device according to the first embodiment has a multi-layer structure, interference fringes due to the intermediate layer 5 are observed during the etching process. Therefore, etching of the third cladding layer 6 is stopped by visual observation of the interference fringes due to the intermediate layer 5. Although this etching is performed by visual observation, it may be performed using a device having means for detecting variations in the wavelength due to interference of light beams, instead of visual observation. By performing the etching process in this way, a mesa structure in which etching is accurately stopped at the intermediate layer 5 is formed as shown in FIG. 3(c).

Next, in the step of FIG. 3(d), spaces formed by the etching are filled with the n type GaAs current blocking layers 9 by selective and epitaxial growth by MOCVD.

Subsequently, in the step of FIG. 3(e), after the removal of the SiN film 13 on the cap layer 8, the p type GaAs contact layer 10 is epitaxially grown on the entire structure. Finally, the p side electrode 11 is formed on the contact layer 10 and the n side electrode 12 is formed on the rear surface of the substrate 1, thereby completing the semiconductor laser deice as shown in FIG. 1.

In the semiconductor laser device according to the first embodiment, since the intermediate layer 5 comprises an AlGaInP layer which is sufficiently thin so as to have an energy band gap larger than the radiant energy emitted from the active layer 3, light absorption in the intermediate layer 5 is controlled, thereby suppressing an increase in the threshold current of laser oscillation.

Further, the intermediate layer 5 comprises the AlGaInP layer having a smaller energy band gap than the AlGaInP layer constituting the second cladding layer 4 and the third cladding layer 6 and has the multi-layer structure comprising, alternatingly laminated, AlGaInP layers 51 and 52. Therefore, even in the etching of the epitaxial layers on the off (100) substrate that lowers the ratio of etching selectivities with respect to AlGaInP/GaInP, the etch stopping effect is sufficiently shown.

Furthermore, in the semiconductor laser device according to the first embodiment, since interference fringes are observed in the intermediate layer during the etching process, the etch stopping effect is further improved.

Embodiment 2

A semiconductor laser device in accordance with a second embodiment of the present invention is fundamentally identical to the semiconductor laser device according to the first embodiment except that in the intermediate layer 5 having the multi-layer structure that can improve the etch stopping effect due to the interference fringes an integer multiple of the thickness of each of the AlGaInP layers 51 and 52 is made equal to the a wavelength of visible light.

That is, the intermediate layer 5 of the semiconductor laser device according to the second embodiment, shown in FIG. 2, comprises a multi-layer structure comprising, alternatingly laminated, six p type $(Al_xGa_{1-x})InP$ (x=0.05) layers 51, each having a thickness of 2.5 nm, and five p type $(Al_xGa_{1-x})InP$ (x=0.7) layers 52 each having a thickness of 5 nm.

In the semiconductor laser device according to the second embodiment, light absorption in the intermediate layer 5 is controlled, an increase in the threshold current of laser oscillation is suppressed, and the etch stopping effect is sufficiently shown. Further, the thicknesses of the AlGaInP layers 51 and 52 constituting the intermediate layer 5 are an integer multiple of each other so that an integer multiple of the thickness of each layer becomes equal to as wavelength of visible light, about 400~700 nm. Therefore, the interference fringes are clearly observed during the etching process, and the etch stopping effect is further improved. In this case, the intermediate layer 5 may comprise the p type GaInP layers 51 and 52, being restricted to the p type AlGaInP layers 51 and 52, with the same effect as described above.

Embodiment 3

A semiconductor laser device in accordance with a third embodiment is fundamentally identical to the semiconductor laser devices according to the first and second embodiments except that the p type AlGaInP layers 51 and 52 constituting the intermediate layer 5 have the same thickness, respectively.

That is, the intermediate layer 5 of the semiconductor laser device according to the third embodiment, shown in FIG. 2, has a multi-layer structure comprising, alternatingly laminated, six p type $(Al_xGa_{1-x})InP$ (x=0.05) layers 51, each having a thickness of 2.5 nm, and five p type $(Al_xGa_{1-x})InP$ (x=0.7) layers 52 each having a thickness of 2.5 nm.

In the semiconductor laser device according to the third embodiment, light absorption in the intermediate layer 5 is controlled, an increase in the threshold current of laser oscillation is suppressed, and the etch stopping effect is sufficiently shown. Further, the AlGaInP layers 51 and 52 constituting the intermediate layer 5 have the same thickness so that an integer multiple of the thickness of each layer is equal to the a wavelength of visible light, about 400~700 nm. Therefore, the interference fringes are more clearly observed during the etching process, and the etch stopping effect is further improved. In this case, the intermediate layer 5 may comprise the p type GaInP layers 51 and 52, without being restricted to the p type AlGaInP layers 51 and 52, with the same effect as described above.

A semiconductor laser device according to the present invention is not restricted to those described for the first to third embodiments. For example, the thicknesses of the AlGaInP layers 51 and 52 can be changed as long as the absolute values thereof are within a range of 1~10 nm. In addition, although the intermediate layer 5 has a multi-layer structure comprising, alternatingly laminated, six p type AlGaInP layers 51 and five p type AlGaInP layers 52, a multi-layer structure comprising two or more p type AlGaInP layers 51 may be used.

While in the first to third embodiments a ridge type semiconductor laser device having a forward mesa structure is explained, the present invention is not restricted thereto. For example, a semiconductor laser device having a reverse mesa structure or a vertical mesa structure, a mesa type semiconductor laser device that is fabricated without a mesa burying growth, and a semiconductor laser device having an intermediate layer in the vicinity of the active layer, are also within the scope of the present invention.

While in the first to third embodiments the n type GaAs semiconductor substrate is employed, a p type GaAs semiconductor substrate may be employed. In this case, the conductivity type of each semiconductor layer formed on the p type GaAs semiconductor substrate is changed in accordance with the p type GaAs semiconductor substrate.

What is claimed is:

1. A semiconductor laser device comprising:

a first conductivity type GaAs semiconductor substrate; and a structure including, successively, a first conductivity type AlGaInP first cladding layer, an active layer having a band gap energy, a second conductivity type AlGaInP second cladding layer, a second conductivity type AlGaInP intermediate layer, and a second conductivity type AlGaInP third cladding layer, disposed on the first conductivity type GaAs semiconductor substrate, said intermediate layer being within a profile of light produced in said active layer and comprising AlGaInP layers, each layer of said intermediate layer being sufficiently thin so as to have a band gap energy smaller than band gap energies of said second cladding layer and said third cladding layer and larger than the band gap energy of said active layer, said intermediate layer having a multi-layer structure in which $(Al_xGa_{1-x})InP$ layers ($0<x\leq0.2$) and $(Al_xGa_{1-x})InP$ layers ($0.5\leq x\leq1$) are alternatingly laminated.

2. A semiconductor laser device comprising:

a first conductivity type GaAs semiconductor substrate; and a structure including, successively, a first conductivity type AlGaInP first cladding layer, an active layer having a band gap energy, a second conductivity type AlGaInP second cladding layer, a second conductivity type intermediate layer, and a second conductivity type AlGaInP third cladding layer, disposed on the first conductivity type GaAs semiconductor substrate, said intermediate layer being within a profile of light produced in said active layer and comprising AlGaInP layers, each layer of said intermediate layer being sufficiently thin so as to have a band gap energy smaller than band gap energies of said second cladding layer and said third cladding layer and larger than the band gap energy of said active layer, said intermediate layer having a multi-layer structure in which $(Al_xGa_{1-x})InP$ layers ($0\leq x\leq0.2$) and $(Al_xGa_{1-x})InP$ layers ($0.5\leq x\leq1$) are alternatingly laminated, wherein each layer of said intermediate layer has a thickness so that an integer multiple of the thickness is equal to a wavelength of visible light, whereby interference fringes due to said intermediate layer being disposed under said third cladding layer and having the multi-layer structure can be observed during etching of said third cladding layer.

* * * * *